(12) United States Patent
Huang et al.

(10) Patent No.: US 9,046,945 B2
(45) Date of Patent: Jun. 2, 2015

(54) TOUCH CONTROL DEVICE

(71) Applicant: Hannstar Display (Nanjing) Corp., Nanjing (CN)

(72) Inventors: Hao-Chieh Huang, Kaohsiung (TW); Ting-Chen Chiu, Tainan (TW)

(73) Assignee: HannStar Display (Nanjing) Corp., Jiangsu (CN)

( * ) Notice: Subject to any disclaimer, the term of this patent is extended or adjusted under 35 U.S.C. 154(b) by 193 days.

(21) Appl. No.: 13/779,387

(22) Filed: Feb. 27, 2013

(65) Prior Publication Data
US 2013/0222987 A1      Aug. 29, 2013

(30) Foreign Application Priority Data
Feb. 29, 2012   (CN) .......................... 2012 1 0049314

(51) Int. Cl.
*G06F 3/041*      (2006.01)
*H05K 7/00*       (2006.01)
*G06F 3/044*      (2006.01)

(52) U.S. Cl.
CPC *G06F 3/041* (2013.01); *H05K 7/00* (2013.01); *Y10T 428/24826* (2015.01); *Y10T 428/24868* (2015.01); *G06F 3/044* (2013.01); *G06F 2203/04111* (2013.01)

(58) Field of Classification Search
CPC ..................... G06F 3/044; G06F 3/041; G06F 2203/04111; H05K 7/00; Y10T 428/24826; Y10T 428/24868
USPC ................ 428/195.1, 201, 203, 210; 345/174
See application file for complete search history.

(56) References Cited

U.S. PATENT DOCUMENTS

| 2005/0146516 | A1 | 7/2005 | Nishiyama |
| 2007/0215393 | A1* | 9/2007 | Voss-Kehl et al. ......... 178/18.01 |
| 2008/0246741 | A1 | 10/2008 | Hinata |

(Continued)

FOREIGN PATENT DOCUMENTS

| CN | 101458416 | 6/2009 |
| CN | 101950226 | 1/2011 |

(Continued)

OTHER PUBLICATIONS

"Office Action of Chinese Counterpart Application", issued on May 19, 2014, p1-p7.

(Continued)

*Primary Examiner* — Gerard Higgins
(74) *Attorney, Agent, or Firm* — Jianq Chyun IP Office

(57) ABSTRACT

Disclosed is a touch control device, comprising a substrate, a plurality of sensing units, an insulating layer, an electric bridge, a protection layer, a supporting part, an element layer and a glue part. A plurality of sensing units are disposed on the substrate in an interval between two of sensing units to expose portions of the substrate. The insulating layer covers the exposed substrate. The electric bridge covers the insulating layer, and two ends of the electric bridge are respectively connected to two sensing units among the plurality of sensing units. The protection layer covers the electric bridge and the sensing unit. The supporting part covers the protection layer. The element layer is disposed on the supporting part. As a result, an accommodating space is formed therebetween. The accommodating space is filled up with the glue part to glue the protection layer and the element layer.

9 Claims, 3 Drawing Sheets

(56) References Cited

U.S. PATENT DOCUMENTS

| | | |
|---|---|---|
| 2009/0236151 A1* | 9/2009 | Yeh et al. .................... 178/18.03 |
| 2010/0097552 A1* | 4/2010 | Shinya et al. ................. 349/122 |
| 2012/0092580 A1* | 4/2012 | Dighde .......................... 349/58 |
| 2012/0200527 A1* | 8/2012 | Rumsby ........................ 345/174 |

FOREIGN PATENT DOCUMENTS

| | | | |
|---|---|---|---|
| GB | 2472614 A | * | 2/2011 |
| JP | 2008020880 | | 1/2008 |
| JP | 2010205144 | | 9/2010 |
| TW | M371275 | | 12/2009 |
| TW | 201115219 | | 5/2011 |

OTHER PUBLICATIONS

"Office Action of Taiwan Counterpart Application", issued on Aug. 20, 2015, p1-p6, in which the listed references were cited.

* cited by examiner

TOUCH CONTROL DEVICE

CROSS-REFERENCE TO RELATED APPLICATION

This application claims the benefit of China Patent Application No. 201210049314.1, filed on Feb. 29, 2012, in the China Intellectual Property Office, the disclosure of which is incorporated herein in its entirety by reference.

BACKGROUND OF THE INVENTION

1. Field of the Invention

The present invention is related to the technique field of touch control device, and more particularly to a touch control device including the supporting part and capable of effectively controlling the interval.

2. Description of the Related Art

As the technique advances currently, the display devices of hand-held apparatus mostly comprise touch control devices. However, in the process of manufacturing the touch control device, the touching layer and other element layers, and the covering layer or the display module are needed to be glued together because of many reasons. There are two main methods shows as follows:

1. First, the, glue with high viscosity is coated on the periphery of the touching layer, and then the glue with low viscosity is coated on the touching layer. The goal of using the glue with high viscosity is to prevent the glue with low viscosity from overflowing. However, the interval between the touching layer and other element layers is not easy to be controlled in the process of gluing. Therefore, the phenomena such as the lack of the glue (air bubbling) and the overflowing of the glue (extra addition of the glue-wiping process) are very usual.

2. The glue with low viscosity is coated directly on the touching layer, and is stationary set for allowing the gradual disappearance of the air bubbles. However, the longer the stationary time period, the easier the overflowing of the glue. When the overflowing of the glue is occurred, sufficient work of people is required to wipe the overflowing glue. Therefore, not only the cost increases but also the touch control device may get damaged.

SUMMARY OF THE INVENTION

The present invention is to overcome the problems, such as a lack of the glue, an overflowing of the glue, the increase in the cost and the damage of the touch control device, by providing a touch control device which can fix the interval, thereby solving aforementioned problems, and getting better uniformity of distribution of the capacitance values of the touch control device.

To overcome aforementioned problems, the present invention provides a technical solution as the following:

A touch control device comprises a substrate, a plurality of sensing units, an insulating layer, an electric bridge, a protection layer, a supporting part, an element layer and a glue part, wherein the plurality of sensing units are disposed on the substrate in an interval to expose portions of the substrate. The insulating layer covers the exposed portion of the substrate. The electric bridge covers the insulating layer, and two ends of the electric bridge are respectively electrically connected to two sensing units among the plurality of sensing units. The protection layer covers the electric bridge and the sensing units. The supporting part covers the protection layer. The element layer is disposed on the supporting part to jointly form an accommodating space. The accommodating space is filled up with the glue part to glue the protection layer and the element layer. The supporting part is disposed on the upper side of any one of the two ends of the electric bridge. The supporting part has a thickness so that the protection layer and the element layer are uniformly spaced apart from each other. The material of the sensing unit can be Indium Tin Oxide (ITO). The material of the electric bridge 134 can be metal, Indium Tin Oxide or other conductive substances. The material of the supporting part can be a substance having elastic resilience such as resin. The material of the glue part can be ultraviolet light curing glue.

One feature of the touch control device of the present invention is that through the supporting part to fix the interval between the protection layer and the element layer, and thus to control the amount of glue used to be filled up in the glue part, and further to reduce the possibility of the lack of the glue.

Another feature of the touch control device of the present invention is that through the supporting part to fix the interval between the protection layer and the element layer, and to control the amount of glue used to be filled up in the glue part and the irradiating ultraviolet light to avoid the phenomenon of the overflowing of the glue, and further to reduce the cost and the damage toward the touch control device.

In addition, the substrate of the touch control device in the present invention can be a touching sensing substrate, and the element layer can be a covering layer. The substrate is disposed on the exterior display device, and the material of the substrate and the element layer can be glass, organic glass or other light-transmitting substances. Furthermore, the thickness of the substrate is in a range of 0.5 to 0.7 millimeter. The thickness of the sensing unit is in a range of 0.5 to 0.7 millimeter. The thickness of the insulating layer is in a range of 0.5 to 3 micrometers. The thickness of the electric bridge is 0.3 micrometer. The thickness of the protection layer is in a range of 0.5 to 3 micrometers. The thickness of the supporting part is in a range of 0.1 to 0.2 millimeter. The thickness of the element layer is in a range of 0.5 to 0.7 millimeter.

Additionally, the substrate of the touch control device in the present invention can be a covering layer, and the element layer can be a display module or a polarizer of the display module. The thickness of the substrate is in a range of 0.5 to 0.7 millimeter. The thickness of the sensing unit is in a range of 0.5 to 0.7 millimeter. The thickness of the insulating layer is in a range of 0.5 to 3 micrometers. The thickness of the electric bridge is 0.3 micrometer. The thickness of the protection layer is in a range of 0.5 to 3 micrometers. And the thickness of the supporting part is in a range of 0.1 to 0.2 millimeter.

In summation of the description above, the touch control device of the present invention includes the advantages as follows:

(1) By using the supporting part, the interval between the protection layer and the element layer is fixed, and the amount of glue used to be filled up in the glue part is controlled, and further the possibility of the lack of the glue is reduced.

(2) By using the supporting part, the interval between the protection layer and the element layer is fixed, and the amount of glue used to be filled up in the glue part and the irradiating ultraviolet light are controlled to avoid the phenomenon of the overflowing of the glue and further to reduce the cost and the damage toward the touch control device.

DETAILED DESCRIPTION OF THE PREFERRED EMBODIMENTS

The technical contents and characteristics of the present invention will be apparent with the detailed description of a preferred embodiment accompanied with related drawings as follows. For simplicity, the same numerals are used for the same respective elements in the description of the following preferred embodiments and the illustration of the drawings.

Figure 1:
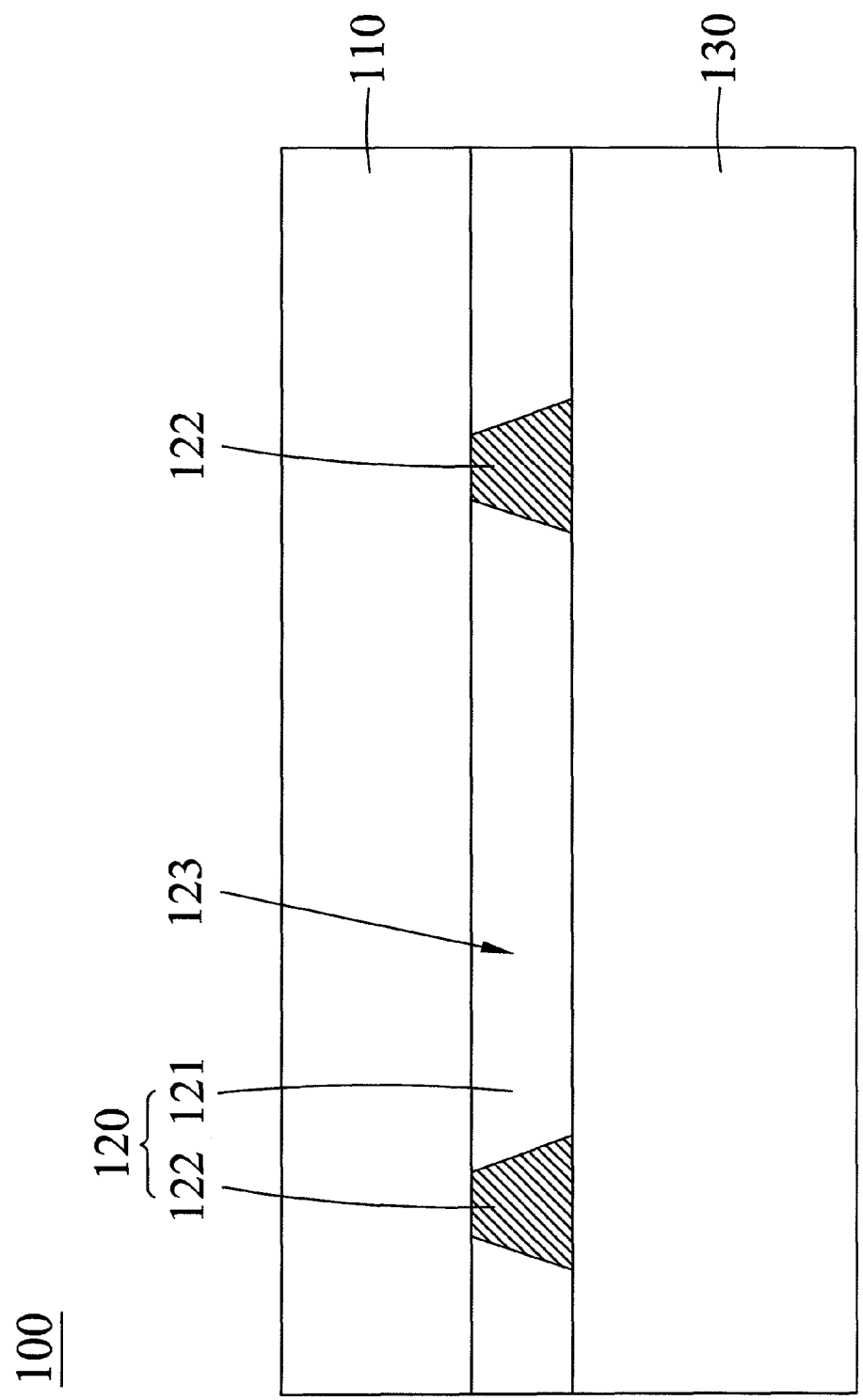
FIG. 1 is a cross-sectional diagram of a touch control device of the present invention.

With reference to FIG. 1, a touch control device 100 of the present invention comprises a touching layer 130, a glue layer 120 and an element layer 110. The touching layer 130 includes touching elements to provide the touching function for the user; the element layer 110 can be a covering layer for protecting the touching layer 130; the element layer 110 can be a display module or a polarizer of the display module, and the covering layer is a cover lens; the glue layer 120 includes a supporting part 122 and a glue part 121. The supporting part 122 is used to fix the thickness of the glue layer 120, and the glue part 121 is used to glue the touching layer 130 and the element layer 110.

Within the touch control device 100 of the present invention, the touching layer 130 is disposed on an exterior display device, and at least one supporting part 122 is disposed on the touching layer 130. Each of the supporting parts 122 can be respectively disposed on each of the four corners of the touching layer 130, or one supporting part 122 with large attaching area is disposed on the touching layer 130. However, it is emphasized that the purpose of disposing the supporting part 122 is to fix the interval between the touching layer 130 and the element layer 110. Thus, any number of the supporting part 122, which can be used to fix the interval between the touching layer 130 and the element layer 110, is included within the scope of the present invention. The supporting part 122, which is coated by a sputtering method, is used to cover a portion of the touching layer 130. The material of the supporting part 122 can be the material having the elastic resilience, wherein the material can be selected as resin. In addition, the material of the supporting part 122 is decided by the practical requirement, such as light-transmitting material. In some conditions, the material of the supporting part 122 is not limited to be a light-transmitting material. If the supporting part 122 locates on black matrix (BM) of the exterior display device, because the black matrix is not light-transmitting, the supporting part 122 can be chosen from the opaque materials.

After finishing the formation of the supporting part 122 of the touch control device 100 of the present invention, the element layer 110 is disposed on the supporting part 122 so that the element layer 110, the supporting part 122 and the touching layer 130 jointly form an accommodating space 123. The accommodating space 123 is filled with the glue part 121 to glue the touching layer 130 and the element layer 110. For example, after forming the supporting part 122, the glue part 121 such as the ultraviolet light curing glue is evenly coated on the exposed touching layer 130 with a coating thickness approximately identical to the thickness of the supporting part 122. Since the thickness of coating is known before coating the glue part 121, the evenly coating can be achieved by controlling the amount of the glue for coating, the pressure of coating, the direction of coating or the range of coating. After coating the glue part 121, the element layer 110 is covered by the supporting part 122 and the glue part 121, and then the glue part 121 is irradiated by the ultraviolet light to cure the glue part 121. In addition, by controlling the thickness of the supporting part 122, not only the intervals between the touching layer 130 and the element layer 110 are uniform, but also the tendency of the distribution of capacitance values on the inner surface of the supporting part can be effectively controlled.

Therefore, the feature of the touch control device 100 of the present invention is that fixing the thickness of the glue layer 120 by using the supporting part 122, so that the coating amount of glue for the glue part 121 is suitably controlled to reduce the possibility of the lack of or the overflowing of the glue before filling up the glue part 121.

Figure 2:
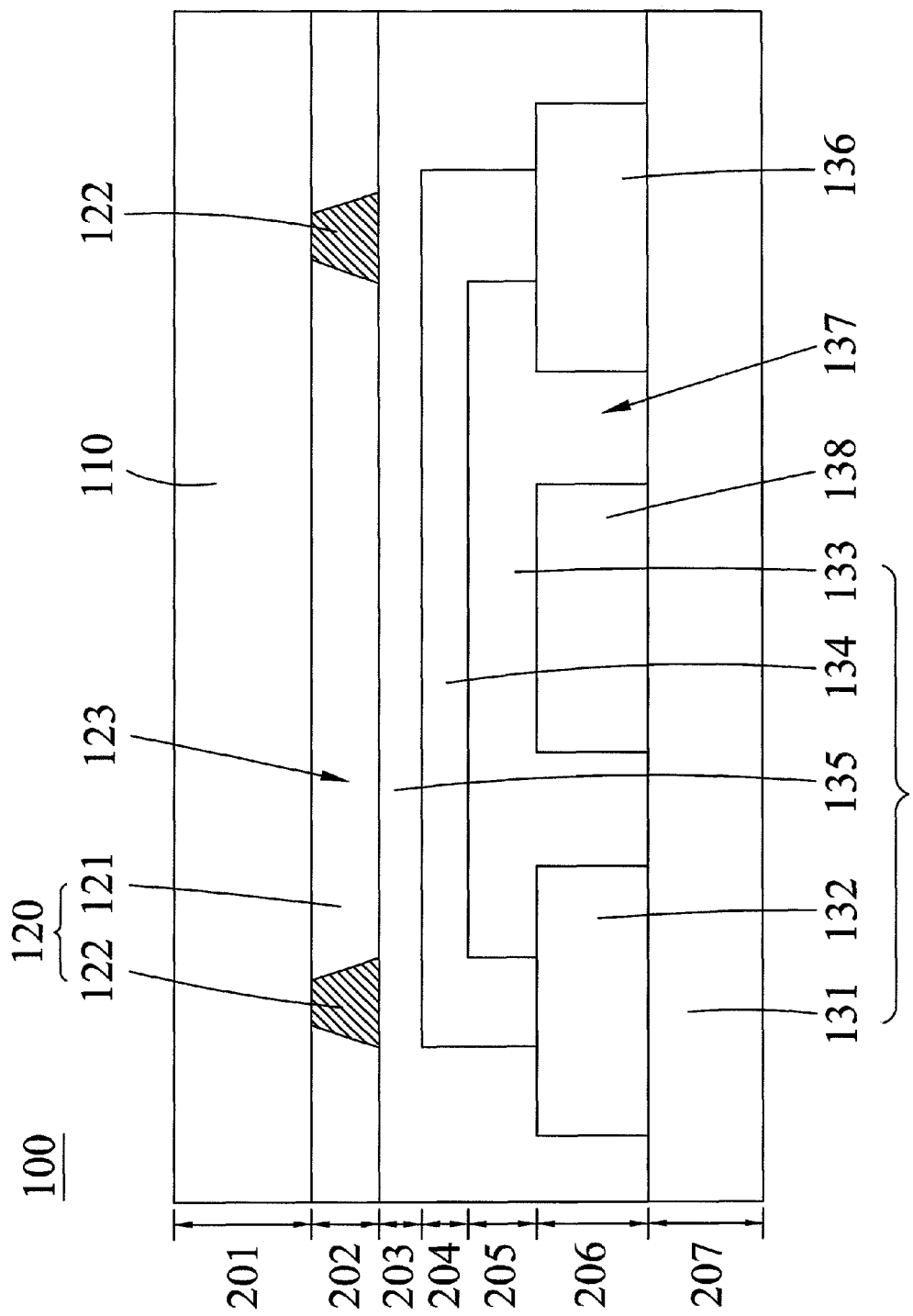
FIG. 2 is a cross-sectional diagram of a preferred embodiment of the touch control device of the present invention.
Figure 3:
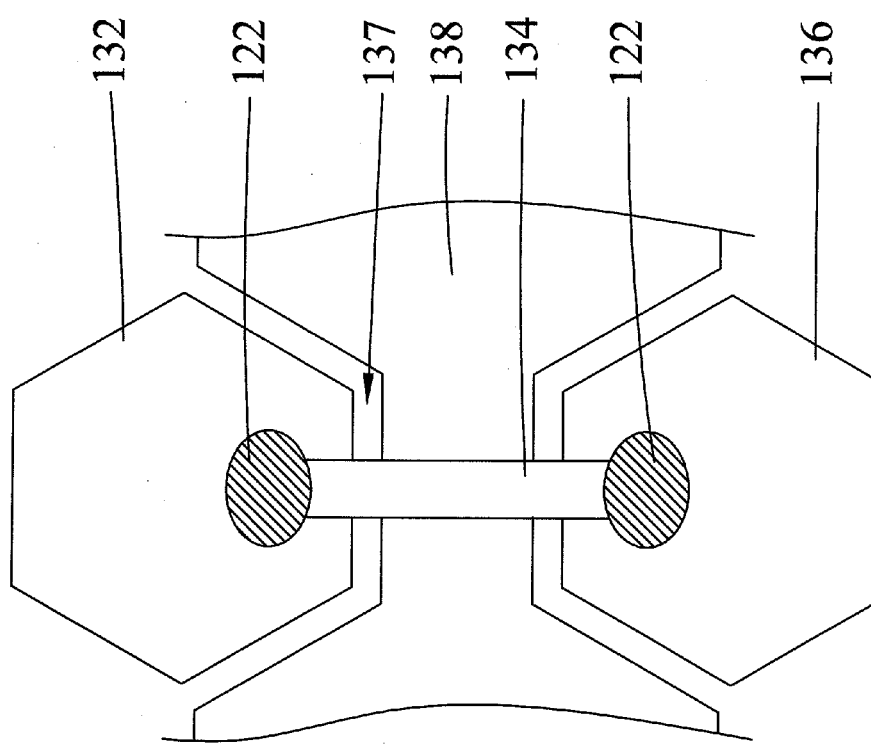
FIG. 3 is a plan view of a supporting part of the preferred embodiment of the touch control device of the present invention.

With reference to FIGS. 2 and 3 for the preferred embodiment of the touch control device of the present invention, the touch control device of the present invention comprises a substrate 131, a plurality of sensing units, an insulating layer 133, an electric bridge 134, a protection layer 135, a glue layer 120 and an element layer 110. Among them, the glue layer 120 includes a supporting part 122 and a glue part 121. The plurality of sensing units is disposed on the substrate 131, and there is an interval between two of the sensing units to expose a portion of the substrate 131. The sensing units 132, 136 and 138 are all disposed on the substrate 131, and there is an interval between the sensing unit 132 and the sensing unit 138. There is also another interval between the sensing unit 138 and the sensing unit 136 so that the sensing unit 132 and the sensing unit 138 are electrically disconnected from each other, and the sensing unit 138 and the sensing unit 136 are electrically disconnected from each other.

A layer of Indium Tin Oxide (ITO) can be sputtered on the substrate 131, and the Indium Tin Oxide is then etched on the location with an interval of 5 mm so that a plurality of openings 137 are formed on the Indium Tin Oxide to expose the substrate 131. Therefore, the Indium Tin Oxide, for example, can form a plurality of sensing units, and there is no electrical connection among these sensing units.

The insulating layer 133 can be used to cover the exposed substrate 131, for example, by sputtering to ensure these sensing units are not electrically connected with each other. In addition, the electric bridge 134 can be used to cover the insulating layer 133, for example, by sputtering. And two ends of the electric bridge 134 are respectively electrically connected to two specific sensing units among these sensing units. The material of the electric bridge 134 can be metals, Indium Tin Oxide or other conductive materials. In the touch control device 100 of the present invention, if the sensing unit 132 and the sensing unit 136 should be electrically connected, one end of the electric bridge 134 is electrically connected to the sensing unit 132, and another end is electrically connected to the sensing unit 136 so that the sensing unit 132 and the sensing unit 136 are electrically connected to each other through the electric bridge 134. Thus, the touch control device 100 of the present invention connects the electric bridge 134 through the sensing unit to fulfill the sensing pattern of the touch control device 100 of the present invention.

The protection layer 135 is designed to cover the electric bridge 134 and the sensing unit to avoid the electric bridge 134 and the sensing units from being damaged from the exterior substance such as the liquid glue. For example, without the protection layer 135, the exterior substance such as the liquid glue can be easily attached on the electric bridge 134 and the sensing unit, and then the electric bridge 134 and the sensing unit can get damage so that the user could not operate the touch control device. Therefore, the touch control device 100 of the present invention protects the electric bridge 134 and the sensing unit by the protection layer 135. In addition, the insulating layer 133 and the protection layer 135 can be a transparent protection layer.

Furthermore, the supporting part 122 is designed to cover a portion of the protection layer 135, and the supporting part 122 is provided with a specific thickness to fix the thickness of the glue layer 120. The material of the supporting part 122 can be a material having elastic resilience, or also be resin. In addition, if there is an opaque substance on the upper or the lower side of the supporting part 122, the material of the supporting part 122 can be an opaque substance. For example, if the supporting part 122 is located on the upper side of the black matrix or the shell of the exterior display device, because the black matrix or the shell belongs to the opaque substances, the material of the supporting part 122 can be the opaque substance. Additionally, if the material of the electric bridge 134 is a metal or an opaque conductive material, and the supporting part 122 is located on the upper or the lower side of the electric bridge, the material of the supporting part 122 is not limited thereto because the material of the electric bridge 134 is an opaque substance.

On the other hand, if the supporting part 122 is located on the upper or the lower side of the light-transmitting substance, the material of the supporting part 122 should be a substance with high transparency. Although the substance has the property of high transparency, it is impossible that the transparency of the substance can achieve 100%. Therefore, the user probably can observe the existence of the supporting part 122. Thus, the supporting part 122 can be disposed on the upper side at one end of the electric bridge 134. The material of the electric bridge 134 can be metal, Indium Tin Oxide or other conductive substances. The reason is that because several devices are disposed underneath the end of the electric bridge 134, the transparency at the end of the electric bridge 134 is lower than the transparency at any other locations. Therefore, if the supporting part 122 is added on the upper side at the end of the electric bridge, although the transparency at this location is further lowered, the supporting part 122 located on the upper side at one end of the electric bridge 134 is not easily observed by the user in comparison with other relatively high locations with higher transparency.

Based on the aforementioned, the supporting part 122 can be formed on the upper side at one end of the electric bridge 134 or on the upper side at the substance with low transparency by the way of sputtering to avoid the existence of the supporting part 122 from being observed by the user, and thus preventing the user from getting any bad feeling of his usage.

In addition, the element layer 110 of the touch control device 100 in the present invention can be disposed on the supporting part 122, and the element layer 110, the supporting part 122 and the protection layer 135 jointly form an accommodating space 123, and because the thickness of the supporting part 122 can be a fixed thickness, the intervals between each of the element layer 110 and the protection layer 135 are approximately identical. Additionally, the glue part 121 of the touch control device 100 in the present invention is filled up in the accommodating space 123 to glue the protection layer 135 and the element layer 110. The material of the glue part 121 can be the ultraviolet light curing glue.

Furthermore, in the touch control device 100 of the present invention, the substrate 131 has the thickness 207. The sensing unit has the thickness 206. The insulating layer 133 has the thickness 205. The electric bridge 134 has the thickness 204. The protection layer 135 has the thickness 203. The glue layer 120 has the thickness 202 and the element layer 110 has the thickness 201. The thickness 202 is approximately identical to the thickness of the supporting part 122.

In a preferred embodiment, the substrate 131 of the touch control device 100 in the present invention can be a touching sensing substrate, and the element layer 110 can cover the protection layer. For example, the protection layer can be covered by the cover lens. The substrate 131 is used to be disposed on the exterior display device, and the material of the substrate 131 and the element layer 110 can be glass, organic glass or other light-transmitting substances. Additionally, the thickness 207 is in a range of 0.5 to 0.7 millimeter. The thickness 206 is in a range of 0.5 to 0.7 millimeter. The thickness 205 is in a range of 0.5 to 3 micrometers. The thickness 204 is 0.3 micrometer. The thickness 203 is in a range of 0.5 to 3 micrometers. The thickness 202 is in a range of 0.1 to 0.2 millimeter, and the thickness 201 is in a range of 0.5 to 0.7 millimeter.

And in another preferred embodiment, the substrate 131 of the touch control device 100 in the present invention can cover the protection layer, and the element layer 110 can be the display module or the polarizer of the display module. For example, the protection layer can be covered by the cover lens. The material of the substrate 131 can be glass, organic glass or other light-transmitting substances. The thickness 207 is in a range of 0.5 to 0.7 millimeter. The thickness 206 is in a range of 0.5 to 0.7 millimeter. The thickness 205 is in a range of 0.5 to 3 micrometers. The thickness 204 is 0.3 micrometer. The thickness 203 is in a range of 0.5 to 3 micrometers and the thickness 202 is in a range of 0.1 to 0.2 millimeter.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:
1. A touch control device, comprising
   a substrate;
   a plurality of sensing units, being disposed on the substrate in an interval such that portions of the substrate are exposed therebetween;
   an insulating layer, covering the exposed portions of the substrate;
   an electric bridge, covering the insulating layer, and two ends of the electric bridge being respectively electrically connected to two sensing units among the plurality of sensing units;
   a protection layer, covering the electric bridge and the sensing units;
   at least one supporting part, covering a portion of the protection layer, wherein the at least one supporting part is disposed directly above any one of the two ends of the electric bridge;
   an element layer, being disposed on the supporting part, wherein the supporting part, the protection layer and the element layer jointly forming an accommodating space; and
   a glue part, being filled up in the accommodating space, to glue the protection layer and the element layer.
2. The touch control device of claim 1, wherein the material of the supporting part is a substance having elastic resilience.
3. The touch control device of claim 1, wherein the material of the supporting part is resin.

4. The touch control device of claim 1, wherein the substrate is a touching sensing substrate that can be disposed on an exterior display apparatus, and the element layer is a covering layer.

5. The touch control device of claim 4, wherein a thickness of the substrate is in the range of 0.5 to 0.7 millimeter, a thickness of the sensing units is in the range of 0.5 to 0.7 millimeter, a thickness of the insulating layer is in the range of 0.5 to 3 micrometers, a thickness of the electric bridge is 0.3 micrometer, a thickness of the protection layer is in the range of 0.5 to 3 micrometers, a thickness of the at least one supporting part is in the range of 0.1 to 0.2 millimeter, and a thickness of the element layer is in the range of 0.5 to 0.7 millimeter.

6. The touch control device of claim 1, wherein the substrate is a covering layer and the element layer is a display module.

7. The touch control device of claim 6, wherein a thickness of the substrate is in the range of 0.5 to 0.7 millimeter, a thickness of the sensing units is in the range of 0.5 to 0.7 millimeter, a thickness of the insulating layer is in the range of 0.5 to 3 micrometers, a thickness of the electric bridge is 0.3 micrometer, a thickness of the protection layer is in the range of 0.5 to 3 micrometers, and a thickness of the at least one supporting part is in the range of 0.1 to 0.2 millimeter.

8. The touch control device of claim 1, wherein the material of the glue part is ultraviolet light curing glue.

9. The touch control device of claim 1, wherein the protection layer and the element layer are uniformly spaced apart from each other.

* * * * *